(12) United States Patent
Liu et al.

(10) Patent No.: US 8,198,685 B2
(45) Date of Patent: Jun. 12, 2012

(54) TRANSISTORS WITH METAL GATE AND METHODS FOR FORMING THE SAME

(75) Inventors: Chung-Shi Liu, Hsinchu (TW); Yung-Sheng Chiu, Hsinchu (TW); Cheng-Tung Lin, Hsinchu (TW); Chen-Hua Yu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 677 days.

(21) Appl. No.: 12/343,307

(22) Filed: Dec. 23, 2008

(65) Prior Publication Data

US 2010/0155849 A1 Jun. 24, 2010

(51) Int. Cl.
*H01L 27/092* (2006.01)
*H01L 21/28* (2006.01)
(52) U.S. Cl. ........... 257/369; 257/407; 257/E27.062; 257/E29.128; 257/E21.19; 438/199
(58) Field of Classification Search .......... 257/369, 257/407, E27.062, E29.128, E21.19; 438/199, 438/585
See application file for complete search history.

(56) References Cited

U.S. PATENT DOCUMENTS

| | | | |
|---|---|---|---|
| 6,236,094 B1 * | 5/2001 | Wright | 257/413 |
| 6,524,954 B1 * | 2/2003 | Bakli et al. | 438/659 |
| 7,030,430 B2 * | 4/2006 | Doczy et al. | 257/249 |
| 7,148,548 B2 | 12/2006 | Doczy et al. | |
| 7,153,784 B2 | 12/2006 | Brask et al. | |
| 7,157,378 B2 | 1/2007 | Brask et al. | |
| 7,220,635 B2 | 5/2007 | Brask et al. | |
| 7,355,281 B2 | 4/2008 | Brask et al. | |
| 7,381,608 B2 | 6/2008 | Brask et al. | |
| 2003/0036215 A1 * | 2/2003 | Reid | 438/52 |
| 2009/0039441 A1 * | 2/2009 | Luna et al. | 257/383 |

OTHER PUBLICATIONS

Wan Sik Hwang et al., 2007 Symposium on VLSI Technology Digest of Technical Papers, pp. 156-157.
Wan Sik Hwang et al., IEEE Transactions on Electron Devices, vol. 55, No. 9, Sep. 2008, pp. 2469-2474.

\* cited by examiner

*Primary Examiner* — Wensing Kuo
(74) *Attorney, Agent, or Firm* — Birch, Stewart, Kolasch & Birch, LLP

(57) ABSTRACT

A semiconductor device includes at least one first gate dielectric layer over a substrate. A first transition-metal oxycarbide ($MC_xO_y$) containing layer is formed over the at least one first gate dielectric layer, wherein the transition-metal (M) has an atomic percentage of about 40 at. % or more. A first gate is formed over the first transition-metal oxycarbide containing layer. At least one first doped region is formed within the substrate and adjacent to a sidewall of the first gate.

18 Claims, 9 Drawing Sheets

TRANSISTORS WITH METAL GATE AND METHODS FOR FORMING THE SAME

FIELD OF THE INVENTION

The present disclosure relates generally to the field of semiconductor devices, and more particularly, to metal-oxide-semiconductor field effect transistors (MOSFETs) having a transition-metal oxycarbide containing layer and methods for forming the MOSFETs.

BACKGROUND OF THE INVENTION

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

During the scaling trend, various materials have been implemented for the gate electrode and gate dielectric for CMOS devices. CMOS devices have typically been formed with a gate oxide and polysilicon gate electrode. There has been a desire to replace the gate oxide and polysilicon gate electrode with a high-k gate dielectric and metal gate electrode to improve device performance as feature sizes continue to decrease.

Conventionally, techniques for forming the metal gate electrode can be cataloged as gate-first processes and gate-last processes. For a gate-first process, the metal gate electrode is formed before formation of source/drain regions of the transistors. The formation of the source/drain regions may include ion implantation processes and high-temperature thermal processes for annealing the implanted source/drain regions. During the high-temperature thermal process, the metal gate electrode is subjected to the high-temperature thermal process and is not thermally stable. To solve the problem, a gate-last process forms the source/drain regions within the substrate and a dummy gate within an interlayer dielectric (ILD). After the high temperature thermal process for annealing the source/drain regions, the dummy gate is removed and an opening is formed within the ILD. The metal gate electrode is then filled within the opening. Though the gate-last process may avoid the high temperature thermal process, the gate-last process is more complicate than the gate-first process.

Accordingly, transistor structures with metal gate electrodes and methods for forming the transistor structures are desired.

SUMMARY OF THE INVENTION

In one embodiment, a semiconductor device includes at least one first gate dielectric layer over a substrate. A first transition-metal oxycarbide ($MC_xO_y$) containing layer is formed over the at least one first gate dielectric layer, wherein the transition-metal (M) has an atomic percentage of about 40 al. % or more. A first gate is formed over the first transition-metal oxycarbide containing layer. At least one first doped region is formed within the substrate and adjacent to a sidewall of the first gate.

In another embodiment, a complementary metal-oxide-semiconductor (CMOS) field effect transistor includes a NMOS transistor and a PMOS transistor coupled to each other. The NMOS transistor includes at least one first gate dielectric layer over a first active region of a substrate. A first transition-metal oxycarbide ($MC_xO_y$) containing layer is over the first gate dielectric layer, wherein the transition-metal (M) has an atomic percentage of about 40 at. % or more. A first gate layer is over the first transition-metal oxycarbide containing layer. At least one first doped region is within the substrate and adjacent to a sidewall of the first gate. The PMOS transistor includes at least one second gate dielectric layer over a second active region of the substrate. A second transition-metal oxycarbide containing layer is over the at least one second gate dielectric layer. A second gate layer is over the second transition-metal oxycarbide containing layer. At least one second doped region is within the substrate and adjacent to the second gate.

In one embodiment, a method for forming a transistor device includes forming at least one gate dielectric layer over a substrate. A transition-metal oxycarbide ($MC_xO_y$) containing layer is formed over the gate dielectric layer, wherein the transition-metal (M) has an atomic percentage of about 40 at. % or more to modulate a work function of the transistor device. A gate layer is formed over the transition-metal oxycarbide containing layer. At least one doped region is formed within the substrate and adjacent to a sidewall of the gate layer.

These and other embodiments of the present invention, as well as its features are described in more detail in conjunction with the text below and attached figures.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION OF THE INVENTION

Figure 1A:
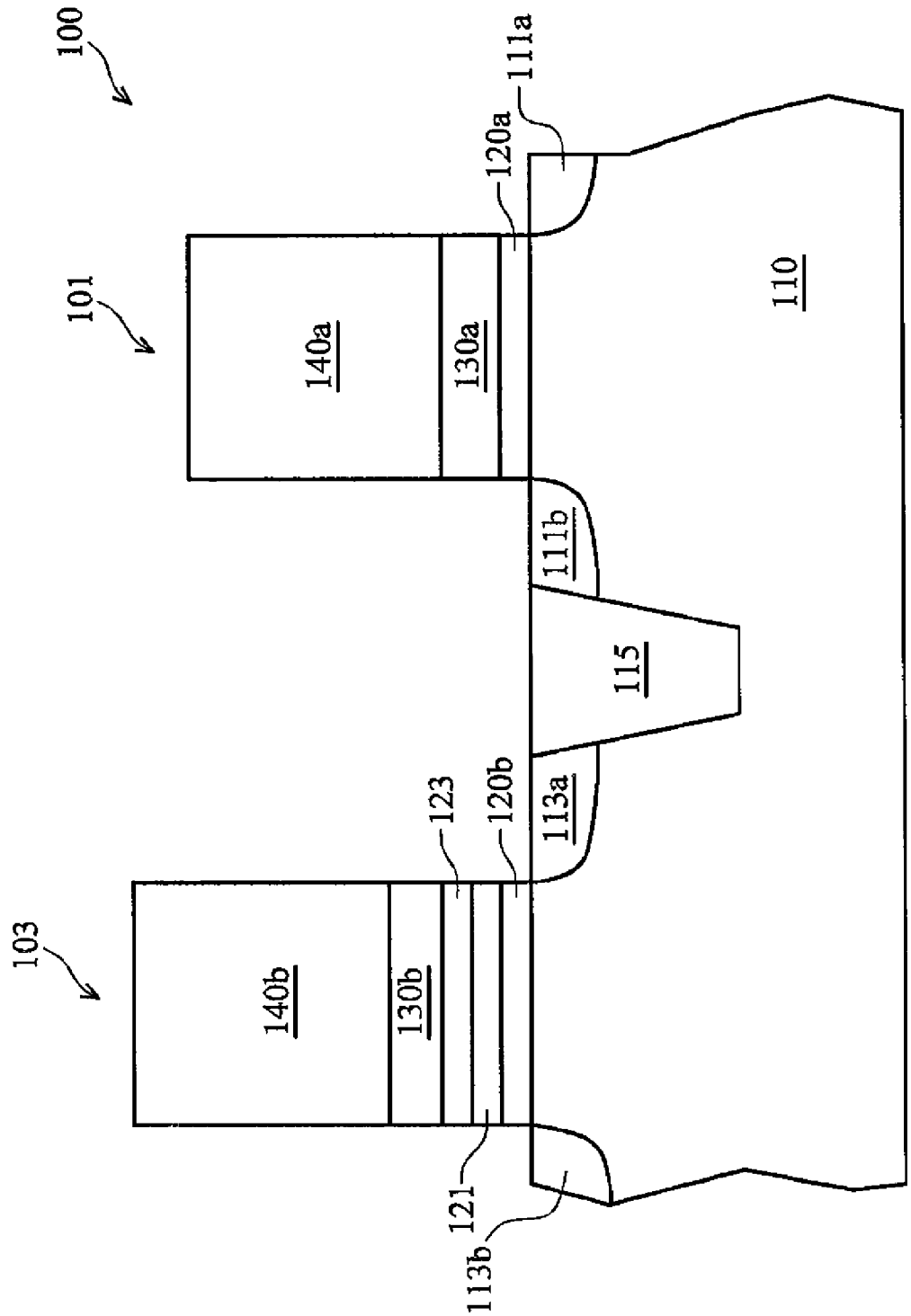
FIG. 1A is a schematic cross-sectional view of an exemplary metal-oxide-silicon field effect transistor (MOSFET) of a gate-first structure.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the invention relate to transistor structures and methods for forming the transistor structures. The transistor structure can include a transition-metal oxycarbide ($MC_xO_y$) containing layer between the gate dielectric layer and the polysilicon gate layer. The transition-metal oxycarbide containing layer includes a transition metal having an atomic percentage of about 40 at. % or more to provide a desired resistivity, work function of the transistor, and/or thermal stability.

FIG. 1A is a schematic cross-sectional view of an exemplary metal-oxide-silicon field effect transistor (MOSFET) structure of a gate-first structure. In FIG. 1A, a MOSFET structure 100 includes a NMOS transistor 101 and a PMOS transistor 103 separated by an isolation structure, such as a shallow trench isolation 115. It is understood that the MOSFET structure 100 may be formed by complementary metal-oxide-semiconductor (CMOS) technology processing. In embodiments of a CMOS transistor, the NMOS transistor 101 is coupled with the PMOS transistor 103.

The NMOS transistor 101 can include doped regions, e.g., source/drain regions 111*a* and 111*b*, within the substrate 110. The NMOS transistor 101 can also include at least one gate dielectric layer 120*a*, a transition-metal oxycarbide ($MC_xO_y$) containing layer 130*a*, and a gate layer 140*a* sequentially formed over the substrate 110. In embodiments for gate-first structures, the gate dielectric layer 120*a* is substantially below the transition-metal oxycarbide containing layer 130*a*.

The semiconductor substrate 110 may comprise an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In one embodiment, the alloy semiconductor substrate may have a gradient SiGe feature in which the Si and Ge composition change from one ratio at one location to another ratio at another location of the gradient SiGe feature. In another embodiment, the alloy SiGe is formed over a silicon substrate. In another embodiment, a SiGe substrate is strained. Furthermore, the semiconductor substrate may be a semiconductor on insulator, such as a silicon on insulator (SOI), or a thin film transistor (TFT). In some examples, the semiconductor substrate may include a doped epi layer or a buried layer. In other examples, the compound semiconductor substrate may have a multilayer structure, or the substrate may include a multilayer compound semiconductor structure.

The doped regions 111*a* and 111*b* can be n-type doped regions having dopants such as Arsenic (As), Phosphorus (P), other group V element, or the combinations thereof. In embodiments, the S/D regions 111*a* and 111*b* can include silicide for low resistances.

The at least one gate dielectric layer 120*a* can be a single layer or a multi-layer structure. In embodiments, the at least one gate dielectric layer 120*a* can include an interfacial layer, e.g., a silicon oxide layer, and a high-k dielectric layer over the silicon oxide layer. For embodiments of 32-nm or 28-nm processing technology, the interfacial layer can have a thickness between about 8 Å and about 10 Å and the high-k dielectric layer can have a thickness of about 20 nm or less.

The transition-metal oxycarbide ($MC_xO_y$) containing layer 130*a* can include a transition metal (M), such as Scandium (Sc), Yttrium (Y), Actinium (Ac), Hafnium (Hf), Titanium (Ti), Zirconium (Zr), Tantalum (Ta), Lanthanum (La), Lanthanides, Actinides, other transition metal that is capable of providing a work function of about 4.5 eV or less for a NMOS transistor, and/or the combinations thereof. The transition metal can has an atomic percentage of about 40 at. % or more. Due to the transition metal, the resistivity of the transition-metal oxycarbide containing layer 130*a* and the gate layer 140*a* can be about 1,000 μΩ-cm or less. In embodiments, the resistivity can be about 600 μΩ-cm or less. The transition-metal oxycarbide containing layer 130*a* can provide a work function between about 3.8 eV and about 4.5 eV for the NMOS transistor 101. It is found that the transition-metal oxycarbide containing layer 130*a* can be thermally stable for a rapid thermal anneal (RTA) having a temperature of about 900° C. or more, e.g., 1,035° C. or 1,050° C., for about 1.5 seconds. In embodiments of 32-nm or 28-nm processing technology, the transition-metal oxycarbide containing layer 130*a* has a thickness of about 20 Å and about 300 Å. In other embodiments, the transition-metal oxycarbide containing layer 130*a* has a thickness of about 200 Å.

In embodiments for gate-first structures, the transition-metal oxycarbide containing layer 130*a* is an $HfC_xO_y$ containing layer. The $HfC_xO_y$ containing layer has a composition ratio R=Hf/(C+O) between about 0.9 and about 1.2. . Hf has an atomic percentage between about 40 at. % and about 80 at. %, C has an atomic percentage between about 25 at. % and about 50 at. %, and O has an atomic percentage between about 8 at. % and about 20 at. %.

The gate layer 140*a* is over the transition-metal oxycarbide containing layer 130*a*. The gate layer 140*a* can be, for example, a silicon gate, a polysilicon gate layer, other gate material that is thermally stable at a temperature about 900° C. and more, or the combinations thereof. In embodiments of 32-nm or 28-nm processing technology, the gate layer 140*a* can have a thickness of about 500 Å and about 2.000 Å. In other embodiments, the gate layer 140*a* has a thickness of about 800 Å.

Referring again to FIG. 1A, the PMOS transistor 103 can include doped regions 113*a* and 113*b* within the substrate 110, at least one gate dielectric layer 120*b*, a dielectric cap layer 121, a p-metal containing layer 123, a transition-metal oxycarbide containing layer 130*b*, and a gate layer 140*b* sequentially over the substrate 110. In embodiments, the at least one gate dielectric layer 120*b*, the transition-metal oxycarbide containing layer 130*b*, and the gate layer 140*b* can be similar to the at least one gate dielectric layer 120*a*, the transition-metal oxycarbide containing layer 130*a*, and the gate layer 140*a*, respectively, described above in conjunction with the NMOS transistor 101.

The dielectric cap layer 121 can be a p-metal containing dielectric cap layer. For example, the material of the dielectric cap layer 121 can include aluminum oxide, aluminum, aluminum nitride, other p-type metal containing dielectric material, or the combinations thereof. In embodiments, aluminum and/or oxygen may be implanted into the layer 121. In embodiments of 32-nm or 28-nm processing technology, the dielectric cap layer 121 can have a thickness of about 10 Å or more.

The p-metal containing layer 123 and/or the dielectric cap layer 121 can modulate the work function to about 4.8 eV or more for the PMOS transistor 103. The p-metal containing layer 123 can include a material such as tantalum carbon oxynitride (TaCNO), tantalum nitride (TaN), titanium carbon nitride (TiCN), aluminum oxide ($Al_2O_3$), $AlO_x$, aluminum nitride ($AlN_x$), other p-metal containing material that is capable of modulating the work function of the PMOS transistor 103, or the combinations thereof. In embodiments forming aluminum oxide or aluminum nitride, aluminum and/or oxygen may be implanted into the layer 123. In embodiments of 32-nm or 28-nm processing technology, the p-metal containing layer 123 can have a thickness of about 20 Å and about 200 Å. In other embodiments, the p-metal containing layer 123 can have a thickness of about 50 Å.

As described, the NMOS transistor 101 includes the transition-metal oxycarbide containing layer 130a for provides a desired resistivity and/or work function for the NMOS transistor 101. The PMOS transistor 103 includes the dielectric cap layer 121 and the p-metal containing layer 123 to compensate the work function of the transition-metal oxycarbide containing layer 130b to reach the desired work function for the PMOS transistor 103. By applying the transition-metal oxycarbide containing layers 130a and 130b, the NMOS transistor 101 and PMOS transistor 103 can be thermally stable under an anneal process.

Figure 1B:
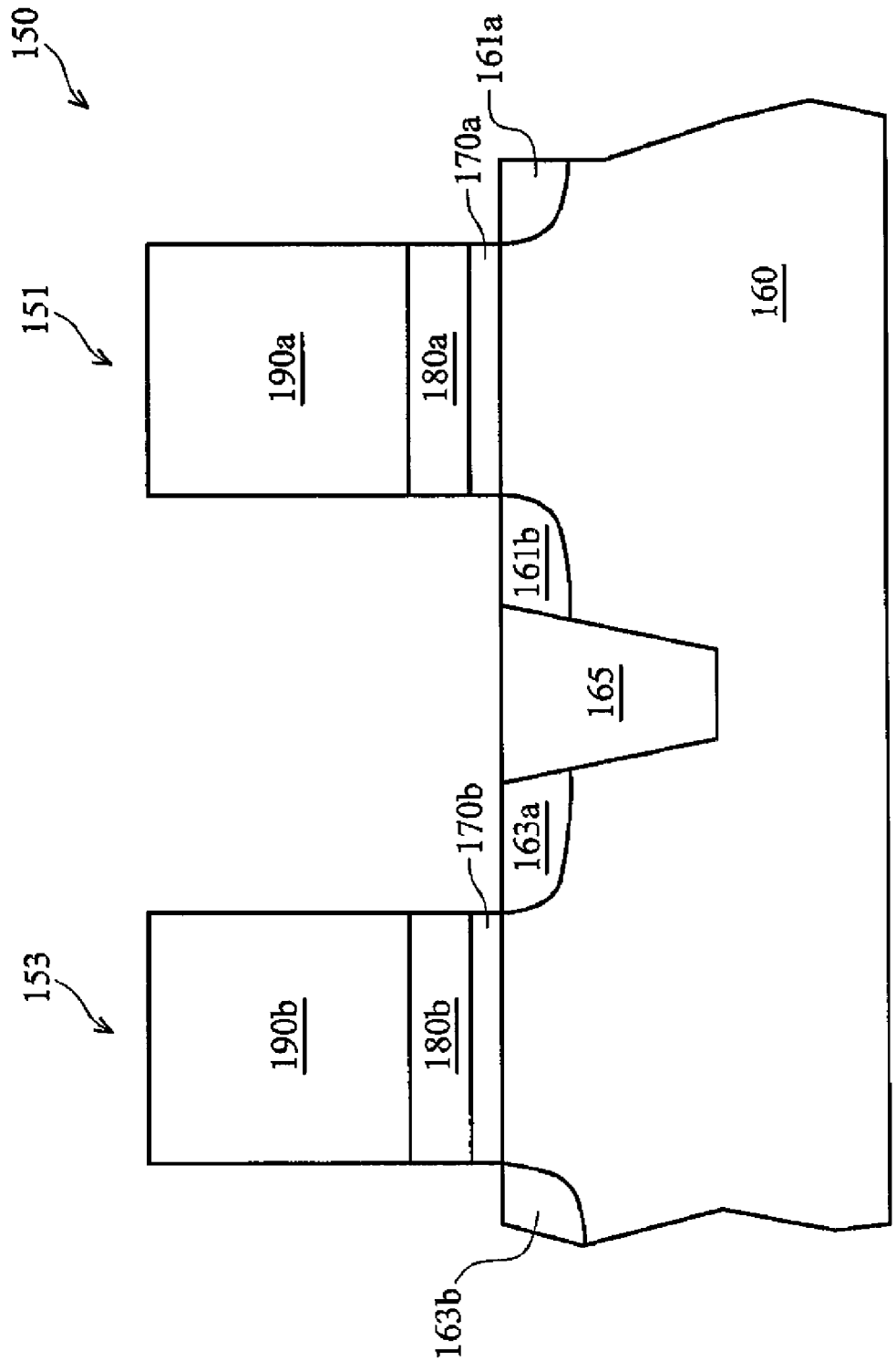
FIG. 1B is a schematic cross-sectional view of another exemplary metal-oxide-silicon field effect transistor (MOSFET) of a gate-first structure.

FIG. 1B is a schematic cross-sectional view of another exemplary metal-oxide-silicon field effect transistor (MOSFET) structure of a gate-first structure. In FIG. 1B, a MOSFET structure 150 includes a NMOS transistor 151 and a PMOS transistor 153 separated by an isolation structure, such as a shallow trench isolation 155. Items of FIG. 1B that are the same items in FIG. 1A are indicated by the same reference numerals, increased by 100. In this embodiment, the gate layer 190a is a n+ doped polysilicon gate 190a and the gate layer 190b is a p+ doped polysilicon gate. The n+ doped gate layer 190a cooperating with the transition-metal oxycarbide containing layer 180a can provide a desired work function of about 4.5 eV or less for the NMOS transistor 151. The p+ doped gate layer 190b cooperating with the transition-metal oxycarbide containing layer 180b can provide a desired work function of about 4.8 eV or more for the PMOS transistor 153. In embodiments, the n+ doped polysilicon gate 190a and the p+ doped polysilicon gate 190b can be formed by implanting n-type dopants, e.g., As and/or P, and p-type dopants, e.g., B.

Figure 2:
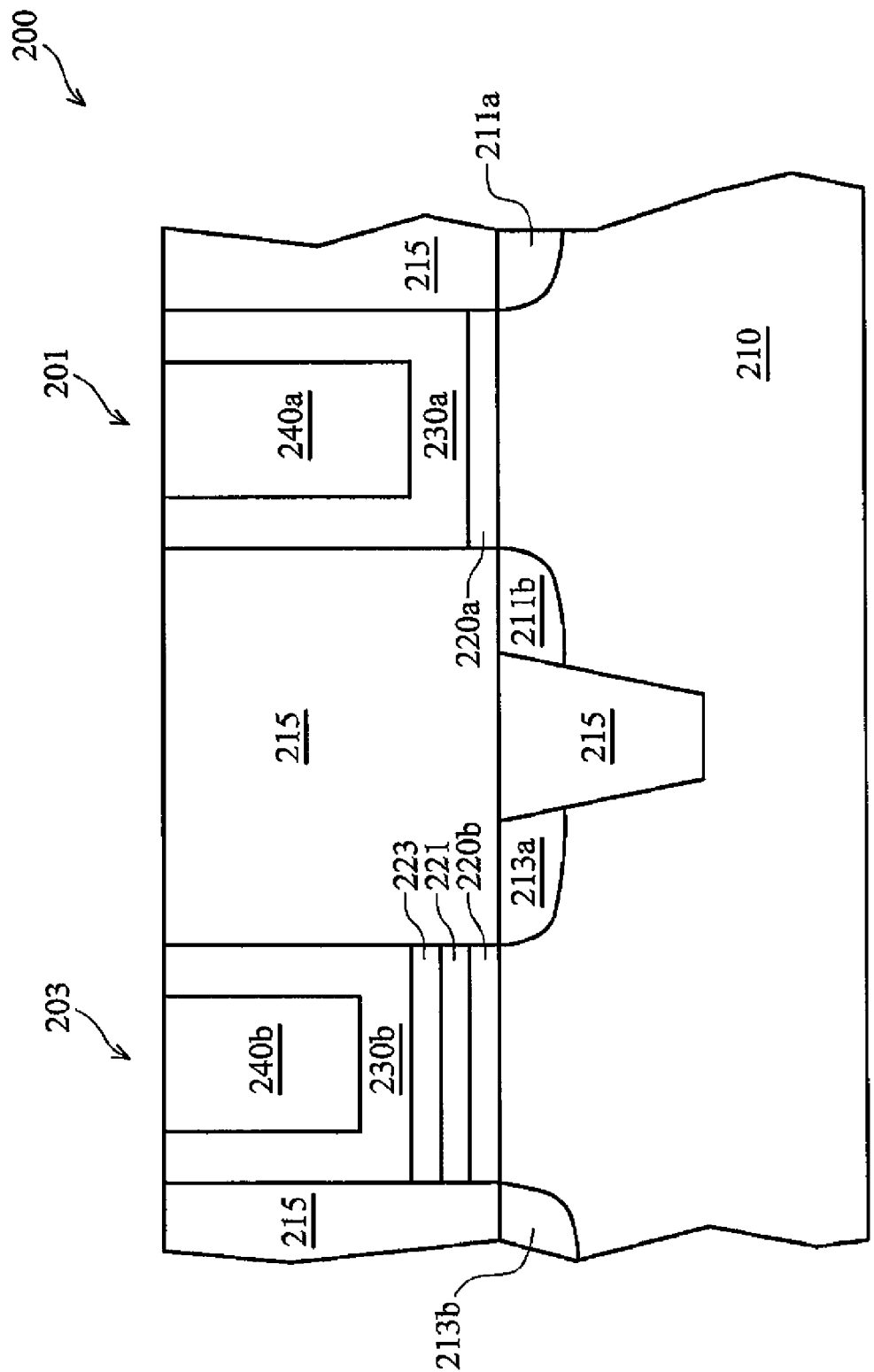
FIG. 2 is a schematic cross-sectional view of an exemplary metal-oxide-silicon field effect transistor (MOSFET) of a gate-last structure.

FIG. 2 is a schematic cross-sectional view of an exemplary metal-oxide-silicon field effect transistor (MOSFET) structure of a gate-last structure. In FIG. 2, a MOSFET structure 200 includes a NMOS transistor 201 and a PMOS transistor 203 separated by an isolation structure, such as a shallow trench isolation 215 and a dielectric layer 215. Items of FIG. 2 that are the same items in FIG. 1A are indicated by the same reference numerals, increased by 100. In embodiments for gate-last structures, the transition-metal oxycarbide ($MC_xO_y$) containing layer 230a can extend from the bottom and along the sidewalls of the gate layer 240a. The transition-metal oxycarbide containing layer 230a can have a composition ratio R=M/C+O between about 0.9 to about 1.6. M can have an atomic percentage between about 40 at. % and about 80 at. %, C has an atomic percentage between about 25 at. % and about 50 at. %, and O has an atomic percentage between about 8 at. % and about 20 at. %.

Figure 3:
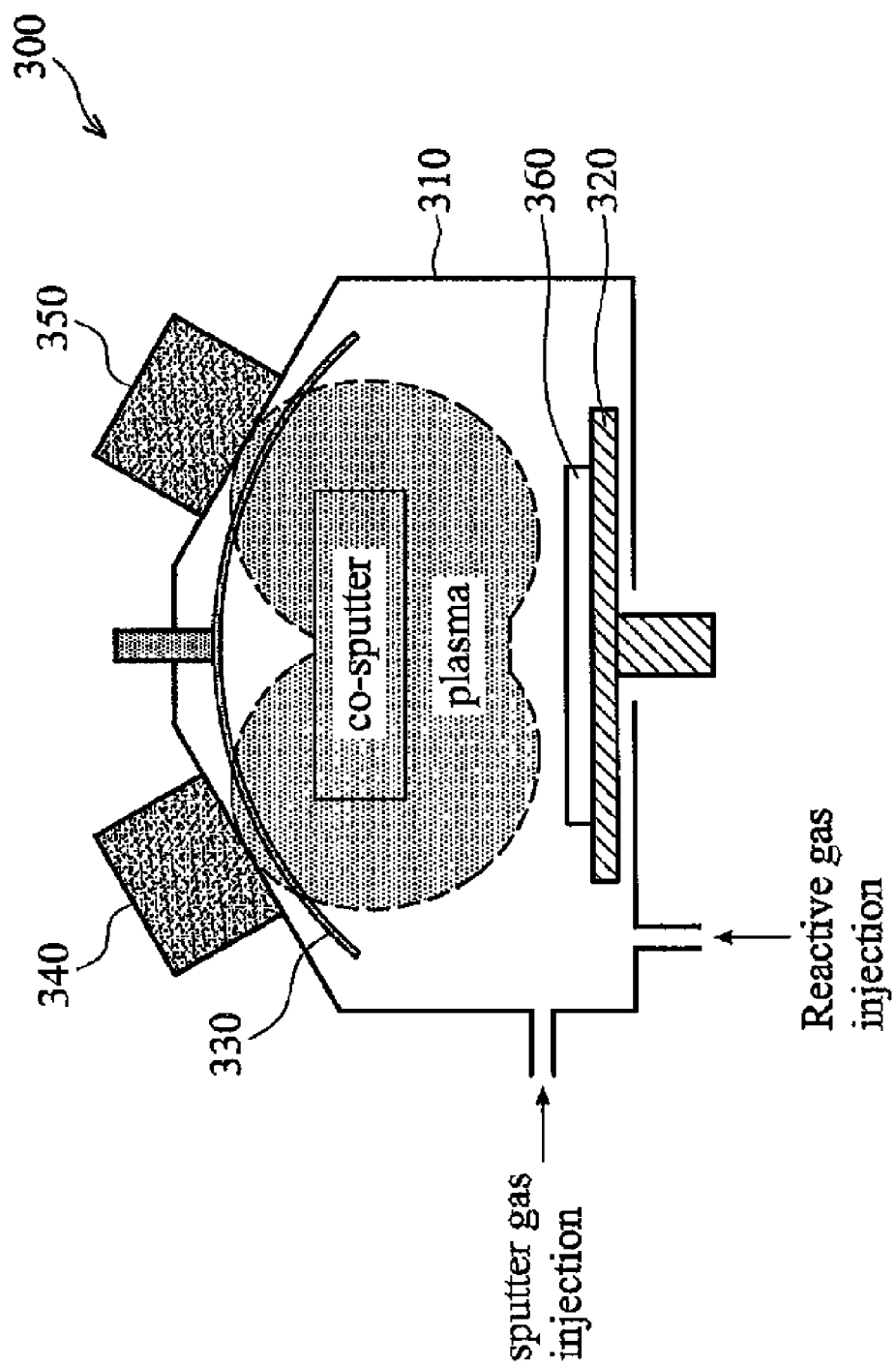
FIG. 3 is a schematic drawing showing an exemplary physical vapor deposition (PVD) sputtering system for forming a transition-metal oxycarbide ($MC_xO_y$) containing layer.

FIG. 3 is a schematic drawing showing an exemplary physical vapor deposition (PVD) sputtering system for forming a transition-metal oxycarbide ($MC_xO_y$) containing layer. In FIG. 3, the sputtering system 300 can include a chamber 310. A substrate holder 320 can be disposed at the bottom of the chamber 310. The substrate holder 320 is configured to support a substrate 360 upon which a transition-metal oxycarbide containing layer is to be formed. A shutter 330 can be disposed at the top region of the chamber 310. Sputter guns 340 and 350 can be disposed on the chamber 310. The sputtering system 300 can include a sputter gas injection valve and a reactive gas injection valve.

In embodiments for forming an Hf oxycarbide layer, the sputter gun 340 includes an Hf-containing target from which the transition metallic component is provided. The sputter gun 350 includes a carbon-containing target from which the carbon component is provided. A sputter gas, such as argon (Ar), is provided via the sputter gas injection valve. An oxygen-containing reactive gas, e.g., oxygen, is provided via the reactive gas injection valve. During depositing the Hf oxycarbide layer, a power between about 500 Watts and about 1,000 Watts is applied to the sputter gun 340 and a power of about 500 Watts or less is applied to the sputter gun 350. The oxygen-containing reactive gas has a flow rate of about 10 standard cubic centimeters per minute (sccm) or less and the sputter gas has a flow rate between about 10 sccm and about 100 sccm. The processing temperature within the chamber 310 is between about the room temperature and about 400° C. By applying the powers to the sputter guns 340 and 350, a co-sputter plasma can be generated within the chamber 310. In other embodiments, the power applied to the sputter gun 340 is about 150 Watts. The power applied to the sputter gun 350 is about 800 Watts. The reactive gas, e.g., oxygen, has a flow rate of about 3 sccm. The Hf oxycarbide layer has a composition ratio R=Hf/C+O of about 1.163. The resistivity of the Hf oxycarbide layer can be about 587 µΩ-cm. The work function of the NMOS transistor of the gate-first structure is about 4.4 eV. The work function of the NMOS transistor of the gate-last structure is about 4.2 eV.

In other embodiments, an alloy having transition metallic carbide (MC), e.g., $Hf_xC_y$, can be used for depositing the Hf oxycarbide containing layer. A single sputter gun may be used to provide Hf component and carbon component over the substrate 360. In still other embodiments, the transition-metal oxycarbide containing layer can be formed by chemical vapor deposition and/or other deposition methods.

Figure 4A:
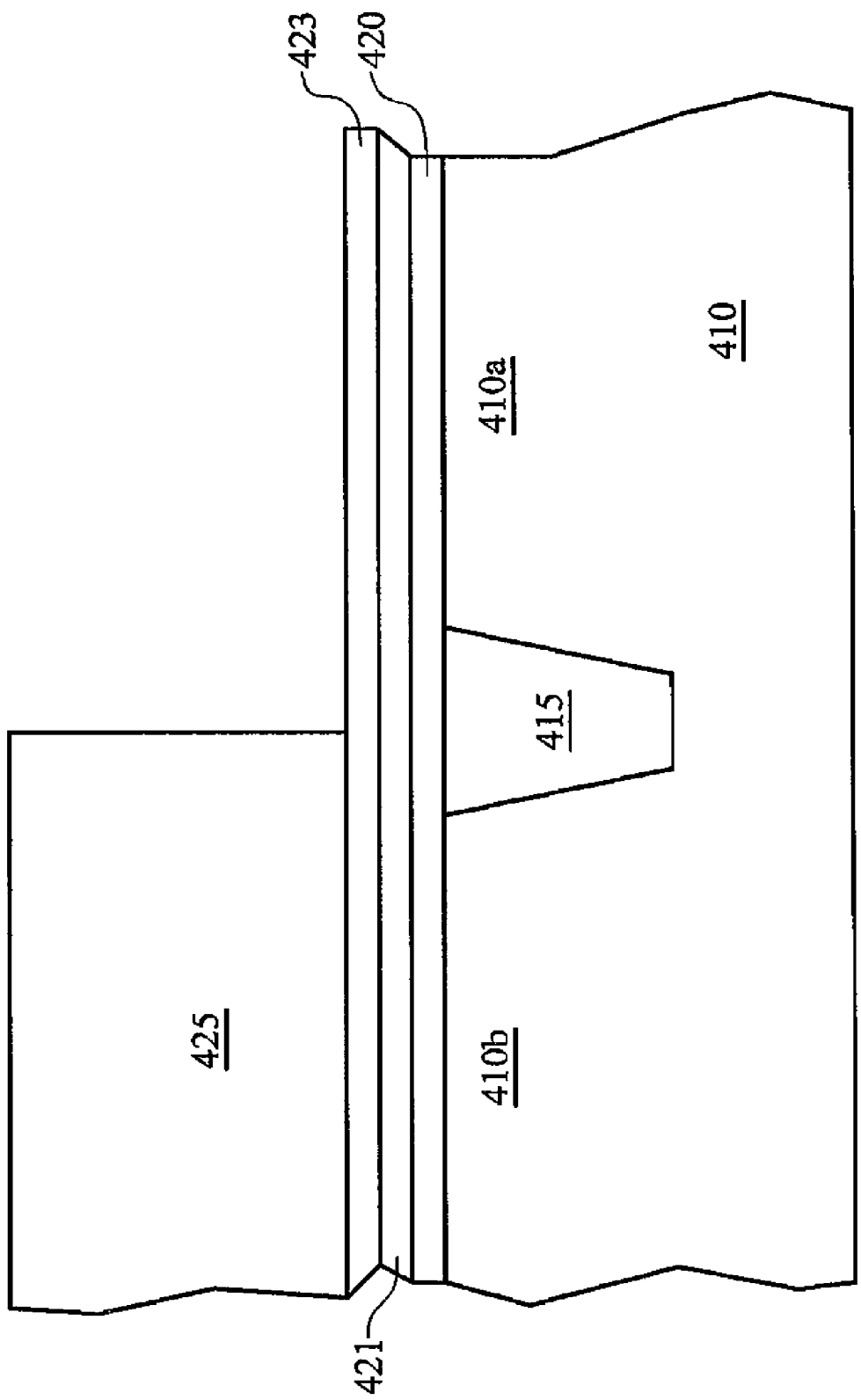
FIGS. 4A-4E are schematic cross-sectional views showing an exemplary process for forming an exemplary metal-oxide-silicon field effect transistor (MOS FET) of a gate-first structure.

FIGS. 4A-4E are schematic cross-sectional views showing an exemplary process for forming an exemplary metal-oxide-silicon field effect transistor (MOS FET) of a gate-first structure. In FIG. 4A, an isolation structure 415 can be formed within a substrate 410 to separate active regions 410a and 410b for a NMOS transistor and a PMOS transistor, respectively. At least one gate dielectric layer 420, a dielectric cap layer 421, and a p-type metal containing layer 423 are sequentially formed over the substrate 410. A patterned photoresist layer 425 is formed over the p-type metal containing layer 423, covering the active region 410b. The gate dielectric layer 420, the dielectric cap layer 421, and the p-type metal containing layer 423 are similar to the gate dielectric layer 120a, the dielectric cap layer 121, and the p-type metal containing layer 123, respectively, described above in conjunction with FIG. 1A.

The isolation structure 415 may be formed on the substrate 410 to isolate active regions 410a, 410b of the NMOS and PMOS transistor device regions, respectively. The isolation structure 415 may utilize isolation technology, such as local oxidation of silicon (LOCOS) or shallow trench isolation (STI), to define and electrically isolate the various active regions 410a, 410b. In the present embodiment, the isolation structure 415 includes a STI. The isolation structure 415 may comprise silicon oxide, silicon nitride, silicon oxynitride, fluoride-doped silicate glass (FSG), a low-K dielectric material, other suitable materials, and/or combinations thereof. The isolation structure 415, and in the present embodiment, the STI, may be formed by any suitable process. As one example, the formation of an STI may include patterning the semiconductor substrate by a conventional photolithography process, etching a trench in the substrate (for example, by using a dry etching, wet etching, and/or plasma etching process), and filling the trench (for example, by using a chemical vapor deposition process) with a dielectric material. In some embodiments, the filled trench may have a multi-layer structure such as a thermal oxide liner layer filled with silicon nitride or silicon oxide.

In embodiments, the gate dielectric layer 420 can include an interfacial layer (not shown) and a high-k dielectric layer (not shown). The interfacial dielectric layer may be formed by any suitable process and any suitable thickness. For example, the interfacial dielectric layer may include a grown silicon oxide layer. In some embodiments, before the interfacial dielectric layer is grown over the substrate 410, a HF-last pre-gate clean (e.g., utilizing an HF solution) and UV process may be performed.

The high-k dielectric layer can be formed over the interfacial dielectric layer. The high-k dielectric layer may include hafnium oxide ($Hf_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), other suitable high-k dielectric materials, and/or combinations thereof. The high-k material may further be selected from metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina ($HfO_2$—$Al_2O_3$) alloy, other suitable materials, and/or combinations thereof. The high-k dielectric layer may be formed by any suitable process, such as atomic layer deposition (ALD), chemical vapor deposition (CVD), physical vapor deposition (PVD), remote plasma CVD (RPCVD), plasma enhanced CVD (PECVD), metal organic CVD (MOCVD), sputtering, plating, other suitable processes, and/or combinations thereof.

The dielectric cap layer 421 can be formed over the gate dielectric layer 420. The dielectric cap layer 421 may comprise aluminum oxide, aluminum, aluminum nitride, titanium, titanium nitride (TiN), tantalum, tantalum nitride, other suitable material, and/or combinations thereof. In embodiments, the dielectric cap layer 421 may be formed by any suitable process, such as CVD, PVD, ALD, thermal oxide, plating, and/or combinations thereof. In other embodiments, the dielectric cap layer 421 can have any suitable thickness. It is understood that the dielectric cap layer 421 may be omitted in alternate embodiments.

The p-metal containing layer 423 may be formed by any suitable process. For example, the p-metal containing layer 423 may be formed by conventional deposition processes. The deposition processes may include PVD, CVD, ALD, sputtering, plating, other suitable methods, and/or combinations thereof.

The patterned photoresist layer 425 can be formed by photolithography patterning processes. The photolithography patterning processes may include photoresist coating (e.g., spin-on coating), soft baking, mask aligning, exposure, post-exposure baking, developing the photoresist, rinsing, drying (e.g., hard baking), other suitable processes, and/or combinations thereof. The photolithography exposing process may also be implemented or replaced by other proper methods such as maskless photolithography, electron-beam writing, ion-beam writing, and molecular imprint.

Figure 4B:
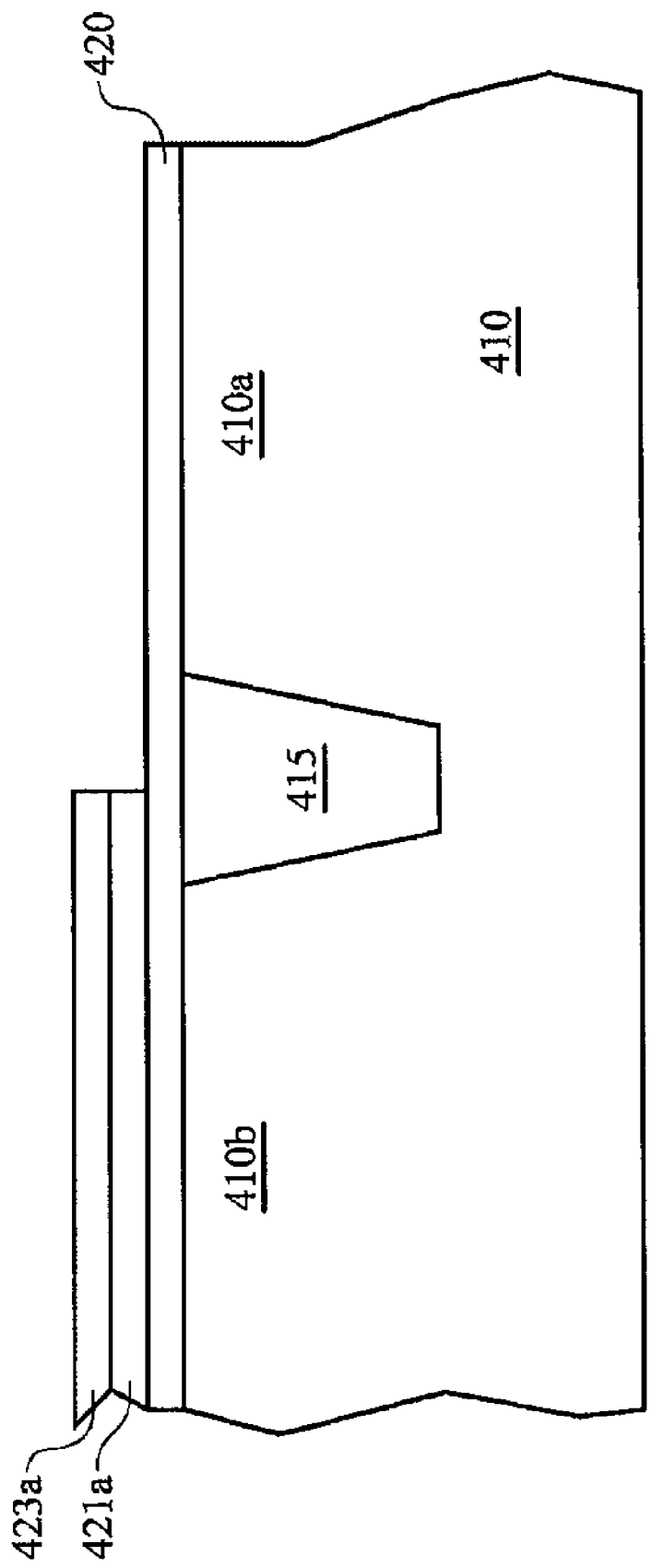

Referring to FIG. 4B, an etching process uses the patterned photoresist layer 425 (shown in FIG. 4A) as a mask, removing portions of the dielectric cap layer 421 and the p-type metal containing layer 423 (shown in FIG. 4A). The etching process may include dry etching, wet etching, and/or other etching methods (e.g., reactive ion etching). The etching process may also be either purely chemical (plasma etching), purely physical (ion milling), and/or combinations thereof. The patterned photoresist layer 425 (shown in FIG. 4A) then is removed by a dry cleaning process and/or a wet cleaning process. The remaining dielectric cap layer 421a and the remaining p-type metal containing layer 423a can cover the active region 410b of the PMOS transistor.

Figure 4C:
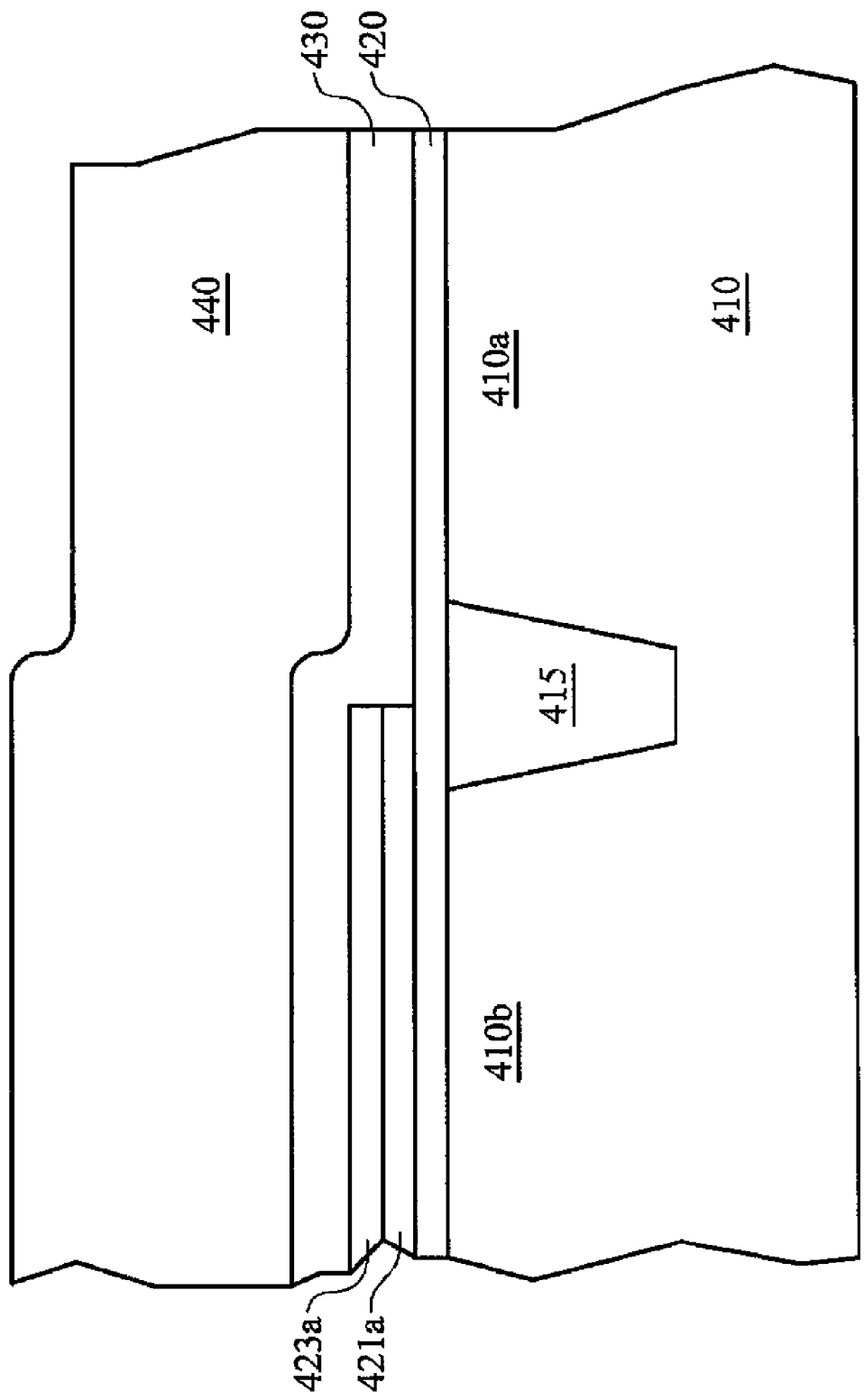

Referring to FIG. 4C, a transition-metal oxycarbide containing layer 430 and a gate layer 440 can be formed over the structure of FIG. 4B. The transition-metal oxycarbide containing layer 430 and the gate layer 440 are similar to the transition-metal oxycarbide containing layer 130a and the gate layer 140a, respectively, described above in conjunction with FIG. 1A. The conditions and system for depositing the transition-metal oxycarbide containing layer 430 can be similar to those described above in conjunction with FIG. 3. In some embodiments, the deposition process may include PVD, CVD, ALD, plating, other suitable methods, and/or combinations thereof.

Figure 4D:
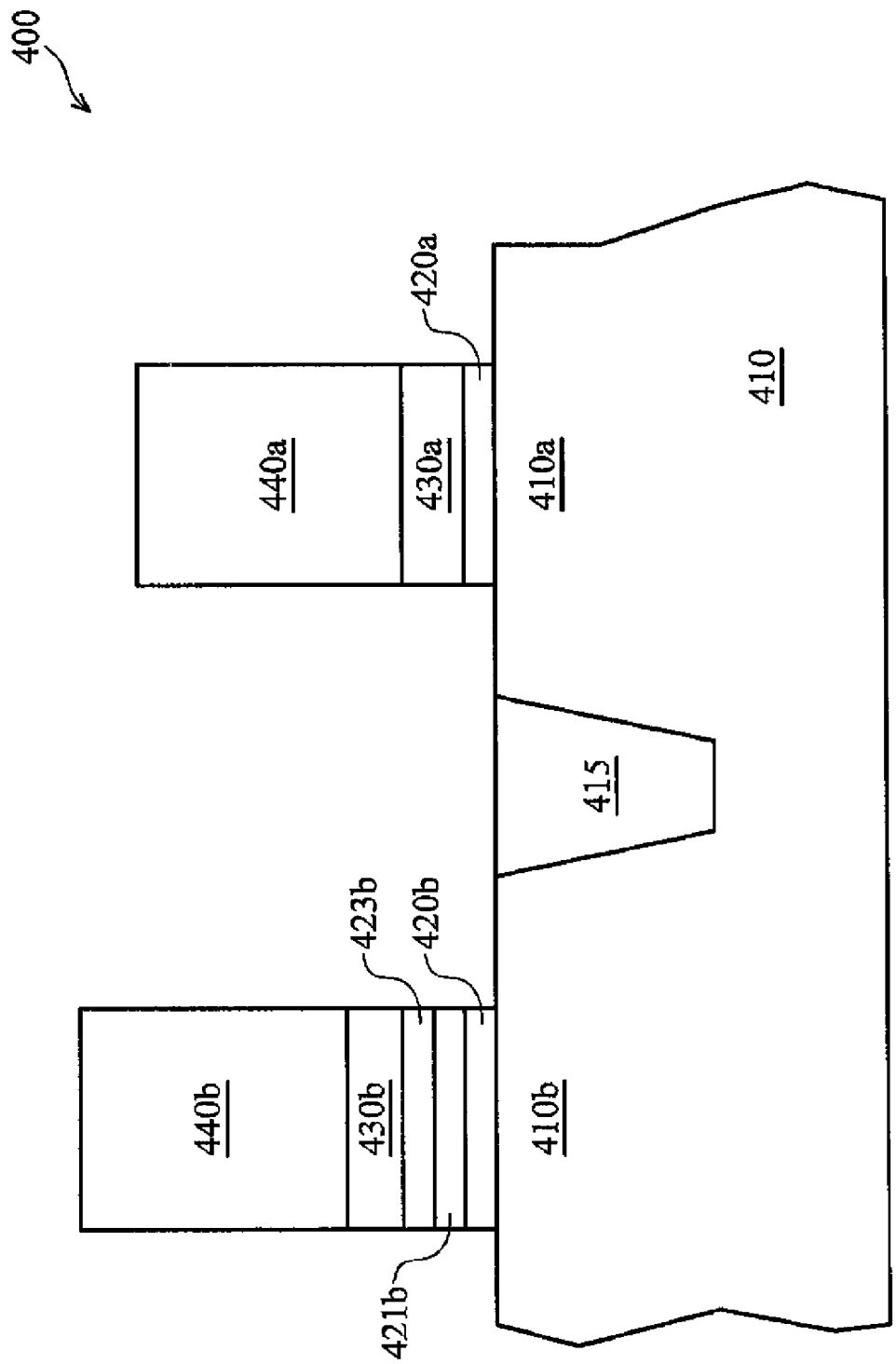

Another patterned photoresist layer (not shown) is formed over the gate layer 440 (shown in FIG. 4C) to define the gate structures for the NMOS transistor and the PMOS transistor. An etch process then uses the patterned photoresist layer (not shown), removing portions of the gate layer 440, the transition-metal oxycarbide containing layer 430, the p-metal containing layer 423a, the dielectric cap layer 421a, and the gate dielectric layer 420. The patterned photoresist layer (not shown) can be removed after the etching process. The gate structure of the NMOS transistor can include the gate dielectric layer 420a, the transition-metal oxycarbide containing layer 430a, and the gate layer 440a. The gate structure of the PMOS transistor can include the gate dielectric layer 420b, the dielectric cap layer 421b, the p-metal containing layer 423b, the transition-metal oxycarbide containing layer 430b, and the gate layer 440b as shown in FIG. 4D.

Figure 4E:
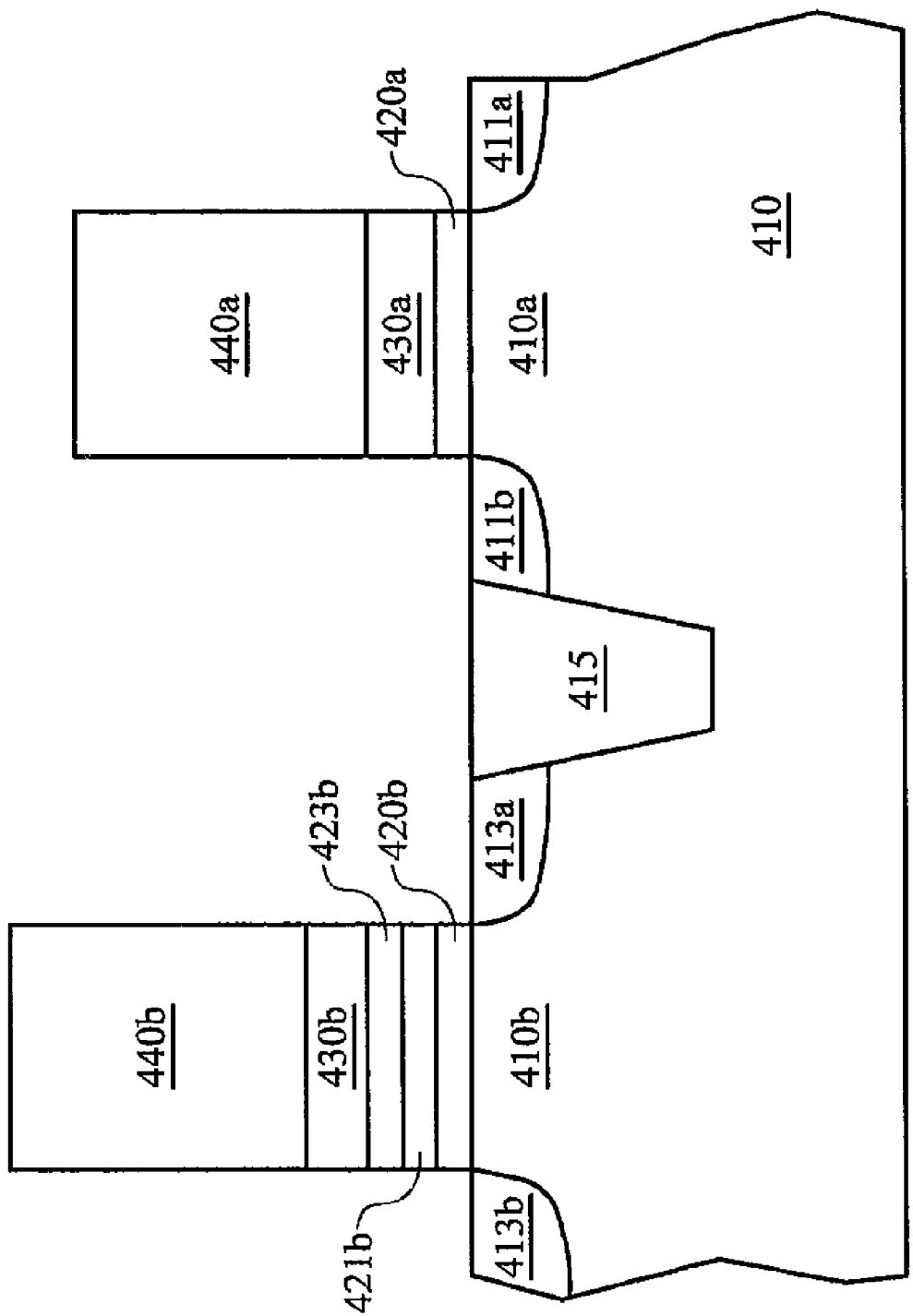

Referring to FIG. 4E, n-type doped regions 411a, 411b and p-type doped regions 413a, 413b are formed within the substrate 410. In embodiments, the doped regions 411a, 411b, 413a, 413b are same as the doped regions 111a, 111b, 113a, 113b, respectively, described above in conjunction with FIG. 1A. The doped regions 411a, 411b, 413a, and 413b can be formed by ion implantation processes.

In embodiments, the doped regions 411a, 411b, 413a, 413b may be formed directly on the semiconductor substrate, in a P-well structure, in a N-well structure, in a dual-well structure, or using a raised structure. The doped regions 411a, 411b, 413a, 413b are formed by any suitable process, such as ion implantation and/or a rapid thermal process (RTP) to activate the doped regions. In some embodiments, the doped regions 411a, 411b, 413a, 413b may be formed by a plurality of ion implantation processes, such as lightly doped drain (LDD) implant processes and source/drain (S/D) implant processes.

In embodiments, a silicide may be formed in the doped regions 411a, 411b, 413a, and 413b. The silicide may comprise materials such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable materials, and/or combinations thereof. The materials utilized to create the silicide may be deposited using PVD such as sputtering and evaporation; plating; CVD such as plasma enhanced CVD (PECVD), atmospheric pressure CVD (APCVD), low pressure CVD (LPCVD), high density plasma CVD (HDPCVD) and atomic layer CVD (ALCVD); other suitable deposition processes; and/or combinations thereof. After deposition, the salicidation process may continue with a reaction between the deposited material and the doped regions at an elevated temperature that is selected based on the specific material or materials. This is also referred to as annealing, which may include a RTP. The reacted silicide may require a one step RTP or multiple step RTPs.

As noted, the RTP having a temperature of about 900° C. or more is performed after the formation of the transition-metal oxycarbide containing layers 430a and 430b. The transition-metal oxycarbide containing layers 430a and 430b are thermally stable in response to the RTP. The transition-metal oxycarbide containing layer 430a can provide a work function of about 4.5 eV or less for the NMOS transistor.

In embodiments, spacers (not shown) can be formed on the sidewalls of the gate layers 440a, 440b to form lightly-doped drains (LDDs) to achieve desired electrical performances. The spacers which are positioned on each side of the gate layers 440a, 440b may comprise a dielectric material such as silicon nitride, silicon oxide, silicon carbide, silicon oxynitride, other suitable materials, or combinations thereof. In some embodiments, the spacers may comprise a multilayer structure. The spacers may be formed by depositing the dielectric material by CVD, ALD, PVD, and/or other suitable processes and then etching.

It is noted that after the formation of the MOSFET structure shown in FIG. 4E any conventional interlayer dielectric (ILD), inter-metal dielectric (IMD), and/or metal interconnection techniques can be performed to couple the NMOS transistor and the PMOS transistor to form the CMOS FET structure. It is also noted that the transition-metal oxycarbide containing layer described above can be applied to various processes for forming metal gates, such as gate-last transistor processes. One of ordinary skill in the art would be able to form various transistors according to the exemplary embodiments described above.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   at least one first gate dielectric layer over a substrate;
   a first transition-metal oxycarbide ($MC_xO_y$) containing layer over the at least one first gate dielectric layer, wherein the transition-metal (M) has an atomic percentage of about 40 at.% or more;
   a first gate over the first transition-metal oxycarbide containing layer;
   at least one first doped region within the substrate and adjacent to a sidewall of the first gate;
   at least one second gate dielectric layer over the substrate;
   a p-type metal containing layer over the at least one second gate dielectric layer;
   a second transition-metal oxycarbide ($MC_xO_y$) containing layer over the p-type metal containing layer, wherein the transition-metal (M) has an atomic percentage of about 40 at.% or more;
   a second gate over the second transition-metal oxycarbide containing layer; and
   at least one second doped region within the substrate and adjacent to a sidewall of the first gate, wherein the first gate is a gate of a n-type transistor and second gate is a gate of a p-type transistor.

2. The semiconductor device of claim 1, wherein the transition-metal (M) is selected from the group consisting of Scandium (Sc), Yttrium (Y), Actinium (Ac), Hafnium (Hf), Titanium (Ti), Zirconium (Zr), Tantalum (Ta), Lanthanum (La), Lanthanides, and Actinides.

3. The semiconductor device of claim 1, wherein the first transition-metal oxycarbide ($MC_xO_y$) containing layer is a Hf oxycarbide ($HfC_xO_y$) containing layer.

4. The semiconductor device of claim 1, wherein the first transition-metal oxycarbide containing layer and the first gate have a resistivity of about 1,000 μΩ-cm or less.

5. The semiconductor device of claim 1, wherein the first gate is a polysilicon gate.

6. The semiconductor device of claim 1, wherein the first transition-metal oxycarbide ($MC_xO_y$) containing layer is substantially below the first gate and has a composition ratio (R)=M/C+O between about 0.9 to about 1.2.

7. The semiconductor device of claim 1, wherein the first transition-metal oxycarbide ($MC_xO_y$) containing layer extends from the bottom and along the sidewall of the first gate and has a composition ratio (R)=M/C+O between about 0.9 to about 1.6.

8. A complementary metal-oxide-semiconductor (CMOS) field effect transistor comprising:
   a NMOS transistor including:
     at least one first gate dielectric layer over a first active region of a substrate;
     a first transition-metal oxycarbide ($MC_xO_y$) containing layer over the first gate dielectric layer, wherein the transition-metal (M) has an atomic percentage of about 40 at.% or more to modulate a work function of the NMOS transistor;
     a first gate layer over the first transition-metal oxycarbide containing layer; and
     at least one first doped region within the substrate and adjacent to a sidewall of the first gate; and
   a PMOS transistor coupled with the NMOS transistor, the PMOS transistor including:
     at least one second gate dielectric layer over a second active region of the substrate;
     a second transition-metal oxycarbide containing layer over the at least one second gate dielectric layer;
     a second gate layer over the second transition-metal oxycarbide containing layer; and
     at least one second doped region within the substrate and adjacent to the second gate;
   wherein the PMOS transistor further comprises a dielectric cap layer and a p-type metal containing layer between the at least one second gate dielectric layer and the second transition-metal oxycarbide containing layer, and the p-type metal containing layer is capable of modulating a work function of the PMOS transistor.

9. The semiconductor device of claim 8, wherein the transition-metal (M) is selected from the group consisting of Scandium (Sc), Yttrium (Y), Actinium (Ac), Hafnium (Hf), Titanium (Ti), Zirconium (Zr), Tantalum (Ta), Lanthanum (La), Lanthanides, and Actinides.

10. The semiconductor device of claim 8, wherein the first transition-metal oxycarbide ($MC_xO_y$) containing layer is a Hf oxycarbide ($HfC_xO_y$) containing layer.

11. The semiconductor device of claim 8, wherein the first transition-metal oxycarbide containing layer and the first gate have a resistivity of about 1,000 $\mu\Omega$-cm.

12. The semiconductor device of claim 8, wherein the first transition-metal oxycarbide ($MC_xO_y$) containing layer is substantially below the first gate and has a composition ratio (R)=M/C+O between about 0.9 to about 1.2.

13. The semiconductor device of claim 8, wherein the first transition-metal oxycarbide ($MC_xO_y$) containing layer extends from the bottom and along the sidewall of the first gate and has a composition ratio (R)=M/C+O between about 0.9 to about 1.6.

14. The semiconductor device of claim 8, wherein the first gate is a n+ doped polysilicon layer to modulate a work function of the NMOS transistor and the second gate is a p+ doped polysilicon layer to modulate the PMOS transistor.

15. A method for forming a transistor device, comprising:
forming at least one first gate dielectric layer over a substrate;
forming a first transition-metal oxycarbide ($MC_xO_y$) containing layer over the first gate dielectric layer, wherein the transition-metal (M) has an atomic percentage of about 40 at.% or more to modulate a work function of the transistor device;
forming a first gate layer over the first transition-metal oxycarbide containing layer;
forming at least one first doped region within the substrate and adjacent to a sidewall of the first gate layer;
forming at least one second gate dielectric layer over the substrate;
forming a p-type metal containing layer over the at least one second gate dielectric layer;
forming a second transition-metal oxycarbide ($MC_xO_y$) containing layer over the p-type metal containing layer, wherein the transition-metal (M) has an atomic percentage of about 40 at.% or more;
forming a second gate over the second transition-metal oxycarbide containing layer; and
forming at least one second doped region within the substrate and adjacent to a sidewall of the first gate, wherein the first gate is a gate of n-type transistor and second gate is a gate of a p-type transistor.

16. The method of claim 15, wherein forming the transition-metal oxycarbide containing layer includes a co-sputtering process including:
providing a sputter gas into a chamber;
providing an oxygen-containing reactive gas into the chamber;
sputtering a transition-metal component from a transition-metal containing target; and
sputtering a carbon component from a carbon-containing target.

17. The method of claim 15, wherein a power applied for sputtering the transition-metal component is between about 500 Watts and about 1,000 Watts, a power applied for sputtering the carbon component is about 500 Watts or less, the sputter gas has a flow rate between about 10 sccm and about 100 sccm, and the oxygen-containing reactive gas has a flow rate of about 10 sccm or less.

18. The method of claim 15 further comprising thermally processing the transistor device at a temperature of about 900° C. or more after forming the transition-metal oxycarbide containing layer.

* * * * *